United States Patent
Lee et al.

(10) Patent No.: US 7,803,451 B2
(45) Date of Patent: Sep. 28, 2010

(54) OPTICAL COMPOSITES BETWEEN SIMILAR AND BETWEEN DISSIMILAR MATERIALS

(75) Inventors: Huai-Chuan Lee, Albany, CA (US); Helmuth E. Meissner, Pleasanton, CA (US)

(73) Assignee: Onyx Optics, Inc., Dublin, CA (US)

( * ) Notice: Subject to any disclaimer, the term of this patent is extended or adjusted under 35 U.S.C. 154(b) by 900 days.

(21) Appl. No.: 11/460,542

(22) Filed: Jul. 27, 2006

(65) Prior Publication Data

US 2010/0215890 A1      Aug. 26, 2010

Related U.S. Application Data

(60) Provisional application No. 60/833,695, filed on Jul. 26, 2006, provisional application No. 60/808,297, filed on May 24, 2006, provisional application No. 60/703,720, filed on Jul. 29, 2005.

(51) Int. Cl.
*B32B 3/00* (2006.01)
(52) U.S. Cl. ............... 428/195.1; 428/201; 428/210; 428/220; 428/304.4; 428/318.4; 428/698; 428/701; 428/702
(58) Field of Classification Search ......... 385/130–132; 428/195.1, 201, 210, 220, 304.4, 318.4, 408, 428/698, 701, 702
See application file for complete search history.

(56) References Cited

U.S. PATENT DOCUMENTS

| | | | |
|---|---|---|---|
| 4,899,347 A * | 2/1990 | Kuchar et al. | 372/33 |
| 5,441,803 A | 8/1995 | Meissner | |
| 5,563,899 A | 10/1996 | Meissner et al. | |
| 5,846,638 A | 12/1998 | Meissner | |
| 5,852,622 A | 12/1998 | Meissner et al. | |
| 5,936,984 A | 8/1999 | Meissner et al. | |
| 6,025,060 A | 2/2000 | Meissner | |

OTHER PUBLICATIONS

Suzanne Miller, Wafer Dicing: A Beginner's Guide, May 24, 2005.*

\* cited by examiner

*Primary Examiner*—Gwendolyn Blackwell
(74) *Attorney, Agent, or Firm*—Townsend and Townsend and Crew LLP

(57) ABSTRACT

Manufacturing techniques and composite structures that are able to meet increasing demanding requirements for large-scale crystal composites (e.g., greater than 100-200 mm in dimensions) that can be manufactured within reasonable time frames. A method of making an optical composite comprises providing first and second components to be bonded along respective surfaces, treating at least one component over at least a portion of the respective surface, and thereafter, bringing the first and second components into optical contact for bonding along the surface having the treated layer. Treating can include one or more of processing the component to provide a porous interface layer, processing the component to form a pattern of channels on the surface to be bonded, and providing an optical coating on the surface to be bonded.

32 Claims, 8 Drawing Sheets

OPTICAL COMPOSITES BETWEEN SIMILAR AND BETWEEN DISSIMILAR MATERIALS

CROSS-REFERENCES TO RELATED APPLICATIONS AND DOCUMENTS INCORPORATED BY REFERENCE

This application claims priority from the following three provisional U.S. patent applications, the entire disclosures of which (including attached documents) are incorporated by reference for all purposes:

1. U.S. Patent Application No. 60/703,720, filed Jul. 29, 2005, titled "Optical Composites Between Similar and Between Dissimilar Materials" and naming as inventors Huai-Chuan Lee, Helmuth E. Meissner, and Oliver R. Meissner;
2. U.S. Patent Application No. 60/808,297, filed May 24, 2006, titled "Optical Composites Between Similar and Between Dissimilar Materials" and naming as inventors Huai-Chuan Lee, Helmuth E. Meissner, and Oliver R. Meissner; and
3. U.S. Patent Application No. 60/833,695, filed Jul. 26, 2006, titled "Optical Composites Between Similar and Between Dissimilar Materials" and naming as inventors Huai-Chuan Lee, Helmuth E. Meissner, and Oliver R. Meissner.

STATEMENT AS TO RIGHTS TO INVENTIONS MADE UNDER FEDERALLY SPONSORED RESEARCH OR DEVELOPMENT

The U.S. Government has rights in this invention pursuant to one or more of the following U.S. Government contracts:
Contract No. W911NF-05-2-0018 awarded by the U.S. Department of Army;
Contract No. FA9451-04-C-0190 P00003 awarded by the Joint Technology Office; and
Contract No. F33615-03-C-5442 awarded by the Air Force Research Laboratory.

BACKGROUND OF THE INVENTION

The present invention relates generally to composite structures that are bonded along an interface, and methods of making them. The invention relates more specifically to crystal, ceramic, and glass composites, especially those having relatively large components.

Recently, there is rapidly growing interest in composite materials for solid-state lasers and other optical and electro-optic applications. The prior art includes the following patents:

U.S. Pat. No. 5,441,803 (the '803 patent) describes a method of forming, and constructs of, bonded composites of single crystal materials. The method comprises the steps of optical contacting the surfaces of the single crystal materials selected to form an assembly, bonding the surfaces by gradually heating the assembly to a temperature and for a duration sufficient to effect bonding, and cooling the bonded assembly back to room temperature. No bonding agents are necessary. This patent applies to bonding similar materials such as doped and undoped lasing materials, and also opens the possibility of producing larger crystals than can be grown by conventional crystal growth techniques.

U.S. Pat. No. 5,846,638 (the '638 patent) describes a bonding process for forming defect-free bonds without the use of adhesives as well as devices formed by this method. In general, the disclosed process allows similar or dissimilar crystalline, vitreous or dense polycrystalline ceramic, metallic or organic polymeric components to be first joined by optical contacting and then heat-treated to stabilize the bond. The heat treatment can be performed at a low enough temperature to prevent inter-diffusion between species, thus insuring that the bond is not subjected to excessive mechanical stresses and that the materials do not undergo phase changes. Therefore, stable bonds can be formed using the disclosed process between materials of widely differing physical, mechanical, thermal, optical and electro-optical properties such as different hardness, chemical durability, mechanical strength, CTEs, thermal conductivity, crystal structure, refractive indices, optical birefringence, nonlinear optical properties, electrical conductivity, or semiconducting properties.

With the advent of requirements for high energy lasers for defense and materials processing applications, difficulties arise when components with longer and wider interfaces are to be optically contacted and heat-treated for bonding. It can take several weeks to obtain an optical contact that is free of trapped volatile species at the interface. Subjecting such an interface prematurely to heat treatment may result in complete or partial separation of the components, or in entrapment of impurities and contaminants at the interface or other interface defects.

SUMMARY OF THE INVENTION

In short, the present invention provides manufacturing techniques and composite structures that are able to meet increasing demanding requirements for high energy lasers for defense and materials processing applications. Embodiments allow the manufacture of large-scale crystal composites (e.g., greater than 100-200 mm in dimensions) within reasonable time frames.

Some embodiments provide composite materials with engineered interfaces that may exhibit antireflective properties by pretreatment of at least one of the interface-forming surfaces with an etchant. Some embodiments provide composite components of dissimilar materials exhibiting low stress birefringence where the stresses due to differences in the coefficients of thermal expansion (CTEs) are relaxed by corresponding spontaneous relative movement of the bonded components with respect to each other.

In one aspect of the invention, a method of making an optical composite comprises providing first and second components to be bonded along respective surfaces, treating at least one component to provide a porous interface layer over at least a portion of the respective surface, and thereafter, bringing the first and second components into optical contact for bonding along the surface having the porous interface layer.

The method may further include, prior to bonding the first and second components, depositing an optical coating on at least a portion of at least one component's respective surface. The method may further include, prior to bonding the first and second components, etching a pattern of channels on at least a portion of at least one component's respective surface.

In another aspect of the invention, a method of making an optical composite comprises providing first and second components to be bonded along respective surfaces, forming a pattern of channels on at least a portion of at least one component's respective surface to assist in venting trapped gas during optical contacting, and thereafter, bringing the first and second components into optical contact for bonding along the surface having the pattern of channels.

The method may further include, prior to bonding the first and second components, depositing an optical coating on at least a portion of at least one component's respective surface.

In another aspect of the invention, a method of making an optical composite comprises providing first and second components to be bonded along respective surfaces, providing an optical coating on at least a portion of at least one component's respective surface, and thereafter, bringing the first and second components into optical contact for bonding along the surface having the optical coating. The coating may, for example, include a transparent layer of carbon and/or one or more dielectric layers.

The method may further include, prior to bonding the first and second components, processing one of the surfaces to be bonded to provide a porous interface layer and/or processing one of the surfaces to be bonded by forming a pattern of channels on at least a portion of at least one component's respective surface to assist in venting trapped gas during optical contacting.

In a particular exemplary composite, the components are doped YAG and CVD diamond with a high-reflectivity coating on one or both of the components. It is believed that the coating remains chemically inert during heat treatment, thereby allowing relative sliding due to differences in expansion to relieve stresses. While the two components in the above example are different, it is possible to form composites where both components are the same material (e.g., YAG). The optical coating at the interface thus allows the two components to behave as if the bond is between dissimilar materials, which is actually the case because YAG will be in contact with the optical coating and not with YAG.

A coating is suitable for bonding if its surface roughness is of the order of less than about 10 Å rms. At higher surface roughnesses, van der Waals bonding does not readily proceed over the full interface area because there tend to be too many high points in the coating that prevent close optical contact. Smooth metal coatings are in general amenable to optical contacting. In the case of not readily oxidizable metals such as gold or platinum, heat treatment does not result in a chemical reaction, and van der Waals bonds are established. Oxidizable metals such as silver, copper, or electroless nickel are preferably heat treated in inert conditions.

Providing a porous interface or a pattern of channels has the advantage of allowing volatile species at the interface to diffuse out more rapidly, thereby allowing shorter processing for the heat treatment used in the bonding process. An additional possible advantage is that the treated surface allows relative movement of the components during heat treatment, thereby relieving stress.

Methods according to embodiments of the invention may be applied to composites where the first and second components are similar materials, and composites where the first and second components are dissimilar materials. In this context, similar materials will typically have closely matching CTEs, say having CTEs that differ in expansion coefficients over the heat treatment range by no more than about $0.03 \times 10^{-6}/°C$. As a practical matter, materials having different chemical compositions are unlikely to be similar.

First, it would be difficult if not impossible to find two materials of different chemical composition that have such a well matching expansion coefficient over a wide temperature range. Even non-isotropic materials will typically have different CTEs in different crystallographic orientations. However, even if their CTEs did match, the chemical composition of the materials could play a role. One material may be more reactive chemically than the other, and would exhibit a tendency to form a chemical bond at the interface which would negate the relative movement of the two materials at the interface with respect to each other.

In another aspect of the invention, an optical composite includes first and second components in optical contact with a porous interface layer derived from pretreatment of at least one of the two components forming the interface. The pretreatment may include increasing the porosity by etching or the like, or forming a patterned structure on one or both components prior to bonding. In some embodiments, a component is formed of a single crystal, and a patterned structure depends on the crystallographic orientation of the single crystal.

In various embodiments, the porous interface may have antireflective properties, and/or may have an optical coating (e.g., including a transparent layer of carbon and/or one or more dielectric layers). Pre-etched channels in large-area interfaces can assist in venting trapped gas during optical contacting. Additionally, the bonding force of the composite has been reduced due to the reduced interfacial contact area and increased separation distance that result from the pretreatment.

In another aspect of the invention, an optical composite includes at least two components of dissimilar material (e.g., YAG and spinel, YAG and silicon carbide, YAG and diamond) wherein the temperature range of heat treatment is below the onset of chemical reactions at the interface and where stresses developed between dissimilar materials are relaxed by relative movement of components parallel to the interface resulting in a stress-free or low-stress condition. YAG is an acronym for yttrium aluminum garnet, and spinel is magnesium aluminate, $(MgAl_2O_4)$.

In another aspect of the invention, the temperature limit of stress-free bonding may be extended by providing an inert optical coating such as transparent carbon (e.g., diamond-like carbon, CVD diamond) at the interface.

A further understanding of the nature and advantages of the present invention may be realized by reference to the remaining portions of the specification and the drawings.

DESCRIPTION OF SPECIFIC EMBODIMENTS

Figure 1:
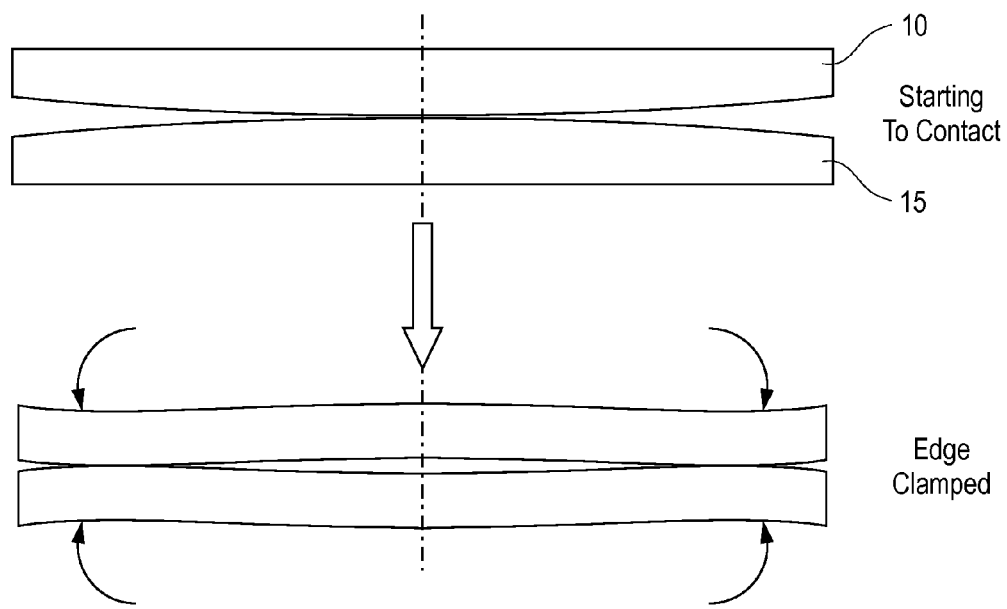
FIG. 1 shows a clamping mechanism between two disks that make optical contact.

Although both the '803 patent and the '638 patent have found a range of applications for solid-state lasers and other electro-optical components and devices, limitations for both of them have become apparent. With the advent of requirements for high energy lasers for defense and materials processing applications, difficulties arise when components with longer and wider interfaces are to be optically contacted and heat-treated for bonding. It can take several weeks to obtain an optical contact that is free of trapped volatile species at the interface. Subjecting such an interface prematurely to heat treatment may result in complete or partial separation of the components, or in entrapment of impurities and contaminants at the interface or other interface defects. Since the labor content and cost of starting crystals increases dramatically for larger crystal composites, the potential for failures together with the long delivery times would make the production of defect-free large crystal composites for solid state lasers such as slab or disk elements or high-yield large diameter wafer bonding impractical and prohibitively expensive.

The present invention provides specific solutions to problems for components that are beyond the practical scope of the '638 patent, i.e., crystal composites beyond 100-200 mm in dimensions. To an extent, the '638 patent is operational for larger sizes as well but the bonding process becomes time-consuming. The present invention significantly reduces the bonding time for components with large interfaces. The prior art contained in the '803 patent and the '638 patent requires highest attainable surface smoothness because this will result in the best interface quality and lowest scatter. Concave surfaces have been characterized as non-desirable in the '638 patent since they cause entrapment of volatile or decomposable species during heat treatment and result in defective interfaces.

The present invention demonstrates that an engineered surface modification will have a number of benefits, both for processing as well as for optical performance. When scaling up to large surfaces, resulting in large interface areas, surface smoothness does not have to be as high as possible because it results in bonds that may become too strong and having undesirable side effects that impede the bonding process. While defects such as macroscopic scratches and non-polished areas need to be absent for most commercial applications, defects that are below the wavelength or on the order of wavelength of the radiation being employed for a specific application may be present without deleterious effects on scattering or laser performance. Visually, there is no difference between a highly polished surface with a root-mean-square (rms) surface finish of the order of about 2-10 Å versus one that is much rougher, e.g., 50-200 Å rms.

These advantages include for processing: Large interfaces can quickly lose entrapped volatile species when there exists a sub-micron porous layer that allows much more readily the evaporation by out-diffusion of trace amounts of volatile species for large area interfaces prior to and even during heat treatment. The porous layer also overcomes or eliminates the occurrence of bubbles that are formed either by any remaining volatile contaminant at the interface or by bonding concave surfaces together which, without that porous layer, would result in entrapment of gaseous species during heat treatment.

Porous layer surface modifications may be created by any available means including etching, mechanically grooving and custom polishing techniques. Another technique that is quite versatile in achieving a very wide range of roughnesses starting with nanometer rms values to 0.5 mm, and does not substantially depend on chemical and mechanical properties is based on magneto-rheological finishing (MRF). Depending on the particle size of suspended diamond powder present in the ferromagnetic polishing fluid, different roughnesses are reproducibly achievable while simultaneously correcting surface irregularities to optical flatness. The actual roughness for a given diamond particle size is dependent on the hardness of the material that is being polished by the MRF technique.

Without this pre-treatment, we have observed the formation of enclosed flat bubbles at the interface due to entrapment of volatiles that were unable to escape, as well as contamination with inorganic nonvolatile contaminants suspected to be due to remaining difficult-to-remove polishing compound. Any silica-containing remaining polishing compound would cause a defect area on the interface that, depending on the specific nature and chemical composition of the components involved, may form a chemical bond there. Large-dimensional interface areas, in width and length, especially in the case of high-aspect-ratio components, have a tendency to seal their outside edges due to preferential volatilization at the edges while the center still contains an excess of hydrogen-bonding species that then cannot readily escape.

If sub-micron or deeper porous layers are impractical because they would destroy specific structures or devices on the wafer surface, such as may be the case for specific wafers that have to be bonded, surface modification by way of venting channels can be provided according to the present invention for volatiles to escape. These channels may consist of a pre-etched or scored outline of the individual chips on the wafer, and serve as guides for subsequent dicing into individual chips. The venting channels also may be mechanically cut or grooved into the bonding surface. Similarly, if large areas of electro-optic crystals are to be bonded as a single large part for processing efficiencies that subsequently are supposed to be diced or cut to smaller final cross sections, an appropriate venting pattern can be accomplished by pre-scoring, mechanically cutting or grooving, or etching. These types of surface pretreatments also allow bonding of components that exhibit surface figures that are not as critical as if a single uninterrupted surface had to be bonded because it has been found that more bending during optical contacting is facilitated between individual scored sections.

Chemically or mechanically pre-etched surfaces of the present invention have the additional benefit that they overcome the adverse effects of subsurface damage that can be ameliorated by etching to an extent that it becomes negligible. This is especially important when interfaces of high laser damage resistance are desirable for high-power solid-state lasers. The etching operation may be performed after the polishing operation, or an etchant may be added to the polishing medium, or a polishing medium may be chosen that acts as etchant on a specific optical material. In the case of magneto-rheological finishing (MRF), mechanical etching may be part of the final surface irregularity correction. In contrast to conventional polishing, MRF processing also has produces surfaces without subsurface damage, due to a material removal by shear force that is different from conventional finishing processes.

Another beneficial effect of surfaces with submicron-scale porous interfaces is the creation of a layer with effectively lower average refractive index at the interface. This is especially useful when the composite components consist of two materials of different refractive index. The effectively lowered refractive index at the interface functions as an antireflective layer that reduces the amount of light that is reflected at the entrance from the lower index to the higher index material, resulting in measurably higher transmission.

Similarly, it is possible to deposit a dielectric or metallic optical coating at the pre-treated optical surface. This has the advantage over optical coatings deposited without pretreatment since coating adhesion is improved, especially after a heat treatment to anneal or consolidate the optical coating on the pre-treated surface.

Specific etching treatment conditions on single crystal surfaces allow the formation of ordered two-dimensional submicron structures of crystalline materials, which may be altered based on the crystallographic orientation for the case of a single crystal. These structures at interfaces between crystals of different functionalities may be useful for nanophotonics applications.

Besides uniform treatment of surfaces to be subsequently bonded, it may be desirable to produce etchant- and crystal orientation-specific patterns by liquid or gas etching or by electron beam lithography on the surface of at least one of the components. Such patterns may be useful for micro-fluidic and photonic devices, as well as reducing or completely eliminating parasitic oscillations during laser operation of a high-power solid state laser.

Surface figures for effective bonding in the '803 patent and the '638 patent have been required to be $1/10$ of the wavelength of light in the visible spectrum (400 nm$\leq\lambda\leq$700 nm) or even better. This strict specification becomes more and more difficult to attain as the surface areas to be polished increase and the thicknesses of the components decrease due to the increasing expense and lower availability of thicker components. The present invention enables the employment of components with surface figures that deviate substantially from $1/10$ to $1/20$ of the wavelength of light when at least one of the surfaces to be bonded to each other contains submicron porosity.

Optical contacting between two single crystal surfaces (e.g., two YAG (yttrium aluminum garnet), two sapphire, or one sapphire and one YAG) requires of the removal of a thin adsorbed film of volatile species that usually is hydrogen-bonded to the surfaces to be bonded and that adheres to each of the two bonding surfaces. Optical contact is defined as the essentially complete contact between two adjacent polished surfaces. In general, optical contact may be obtained at ambient conditions, in vacuum, in vacuum and/or pressure application with or without simultaneous heating. The main feature of an optical contact is the absence of any adhesion-promoting extraneous substance between the two interfaces.

Unless there is at least one component of the two, that form the interface of a composite that contains continuous porosity or channels, formation of defect-free contact bonds at the interface requires an orderly bond progression that allows constant uninterrupted removal of film species at the interface. Otherwise, volatile film species are trapped at or near the center region of the interface. The trapping is possibly caused by the two competing reactions of the contacting bodies. One is the direct intermolecular contact force exerting normal strain (manifested by flattening of bonding surfaces usually starting at the center of the interface surfaces). The other is the flexural displacement by bending.

If the evaporation at the edges of the interface is faster than the progression of bond area to the edge, the edge will become bonded before all volatile species had an opportunity to escape. This becomes a factor in slowing down the rate of complete optical contact bonding, especially for large interfaces and high aspect ratio components, unless there is porosity at the interface that enables the escape of volatile species. The diffusion rate of volatile species across the already bonded region around the edges is believed to be a function of the remaining porosity. Etching or MRF post-treatment of precision polished surfaces according to the present invention brings the rate of diffusion to a practical rate and renders the diffusion rate independent of aspect ratio of the components.

FIG. 1 illustrates the situation for the example of optically contacting two disks 10 and 15. The bending force required to cause this clamping action is aspect ratio dependent (where the aspect ratio is r/h, where r is the radius of the disk and h is the thickness of the disk.). Even though the disk is convex at the contacting surface figure prior to optical contacting, the bending moment prevails when the contact force progresses too slowly or when the volatile species of a surface film evaporates too rapidly, resulting in a clamped edge. The sealing of the edge is difficult to prevent for high aspect ratios, causing entrapment of volatile species in the central area of the interface. The out-diffusion rate becomes exceedingly slow for very smooth polished surfaces, but is increased when at least one of the surfaces has continuous porosity or venting channels imparted to it according to the present invention.

The clamping is thought to be due mainly to the force generated by hydrogen bonding (which is a special kind of van der Waals force involving water or other hydroxyl-containing liquids and hydroxyl-containing surfaces) and selective preferential evaporation of fluid at the edges. Clamping of the edge is actually undesirable because it prevents the controlled evaporation of the fluid from the interface areas that are not close to the edge. A mechanical force applied e.g. by a vise or a press could actually overcome the clamping effect due to fluid evaporation if the applied force is higher than the clamping force and thereby facilitate venting of fluid from the interface.

The present invention is especially applicable to starting components of high aspect ratios being defined as length or width divided by thickness, often implying close-to-net shape structures to minimize loss of valuable crystal or other equally expensive starting materials.

Completely unexpected when bonding dissimilar materials is the absence of stress due to thermal expansion by a corresponding relative movement of the components involved without de-bonding. Usually, it would be expected that a composite consisting of dissimilar materials behaves as has been described in the literature for bimetallic strips, bending and distorting, and resulting in corresponding stress. In the case of brittle materials, this difference of CTEs between components forming the composite will result in catastrophic fracture when the fracture strength of one of the components has been exceeded. It is conjectured that intermolecular forces between adjacent surfaces allow this movement in a specific range of temperature since they do not act between individual ions or molecules of opposing surfaces but exert a macroscopic non-specific interaction between them.

The present invention also encompasses tailoring of the attractive force between two materials by modifying the surface finish of the surface to be bonded to a rougher condition that is visually imperceptible. This is assumed to allow for reduction of the bonding force to lower values to facilitate stress equilibration over large surface areas. It becomes essential when at least one of the components has a tendency to destructively cleave even under low stress that would be generated during relative movement at the interface between these components.

According to the present invention, the maximum heat treatment temperature for crystals such as sapphire with garnets, is dependent on crystallographic orientation. Chemical bonds between adjacent crystal surfaces appear to occur more readily for random orientations of dissimilar crystals due to the closeness of the surface ions and the potential of the formation of eutectics between components of adjacent surfaces. Since random orientations were used in the '638 patent, it was assumed that stress birefringence as function of heat treatment becomes unavoidable for materials having a difference in CTEs because that would be the expected behavior for bimetallic strips or any other composite. Failure to recognize the dependence on crystallographic orientation has resulted in failures of composites during heat treatment, during fabrication and during subsequent finishing operations, especially for the case of large crystals. These failures become very expensive due to the high cost of optical materials, especially single crystals. On the other hand, according to the present invention, crystal surfaces belonging to major crystallographic habit-forming growth planes have been found to be less chemically active. The crystallographic orientation of cubic crystals with large unit cells such as of the garnet structure has been found to be much less important because each surface presents a sufficiently similar pattern of reactive sites.

Whenever high bond strength is required, one has to monitor the stress birefringence as function of temperature to determine the critical threshold temperature beyond which stress will occur between dissimilar materials. The stress is expected to increase exponentially with temperature for a given and constant difference in CTEs. The present invention includes the discovery that there exists a heat-treatment temperature range in which there is no residual stress generated, even though there is a difference in CTEs. The present invention encompasses finding and defining this temperature region for every combination of bonded composites to form stress-free and durable bonds between two dissimilar materials. That region is characterized by heat-treatment of composites to a temperature high enough to ensure strong and sufficiently durable bonds for the intended application and low enough to prevent formation of bonds that will not allow relative movement between component surfaces. This bonding regime is not well understood but is thought to be in the region of permanent chemical bonds or other more localized bonds. The onset temperature for forming permanent bonds at the interface sets the upper limit for heat treatment. This limiting temperature is dependent on the chemical composition, crystallographic orientation, and surface characteristics. The minimum temperature to which the composites have to be heated is at the transition where the bonding regime changes from low-temperature bonding that is presumed to be due at least partially to hydrogen bonding and usually is not stable, to intermolecular bonding. It is on the order of 120-200° C.

In all cases, it is highly desirable that composites of dissimilar materials exhibit low stress or no stress birefringence because it may in selected cases have an adverse effect on mechanical strength and lasing behavior. Composites of laser host materials such as GGG (gadolinium gallium garnet) or YAG with non-laser active materials enable an increase in lasing efficiency in at least three important aspects.

The first aspect is that the cladding layers serve to provide mechanical support, thermal uniformity and an efficient heat conducting path to the heat sink during laser operation. This would be of special interest when the lasing layer has a high aspect ratio, such as would be the case for a long and thin slab structure or a thin laser-active disk. Therefore, the optical and mechanical properties of these composites would be of great interest for the design of solid state lasers especially at high laser fluencies and output powers and for opto-electronic materials in general.

A special case of a cladding layer that has great potential for high-power solid state lasers for materials processing applications consists of a laser-active disk that is circularly surrounded by a laser-inactive or laser radiation-absorbing peripheral layer. The cladding may serve to overcome parasitic oscillations at high fluences and serve as entry port for laser pump radiation in the case when the cladding is capable of transmitting pump radiation with only low absorption loss.

Figure 2A:
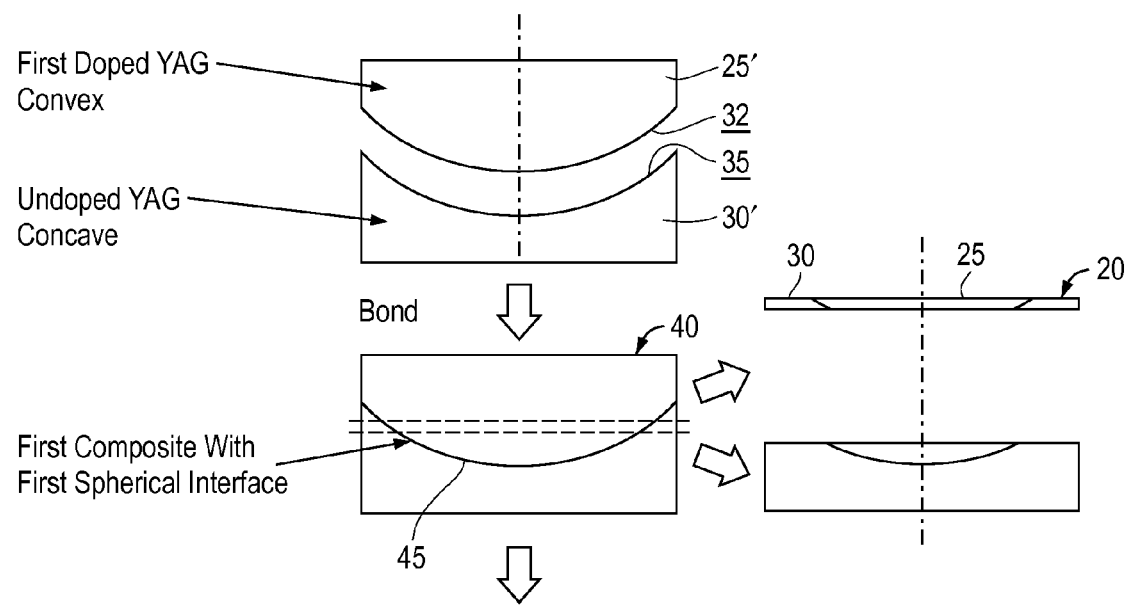
FIG. 2A and FIG. 2B show the production of composites with one or two spherical surfaces.
Figure 2B:
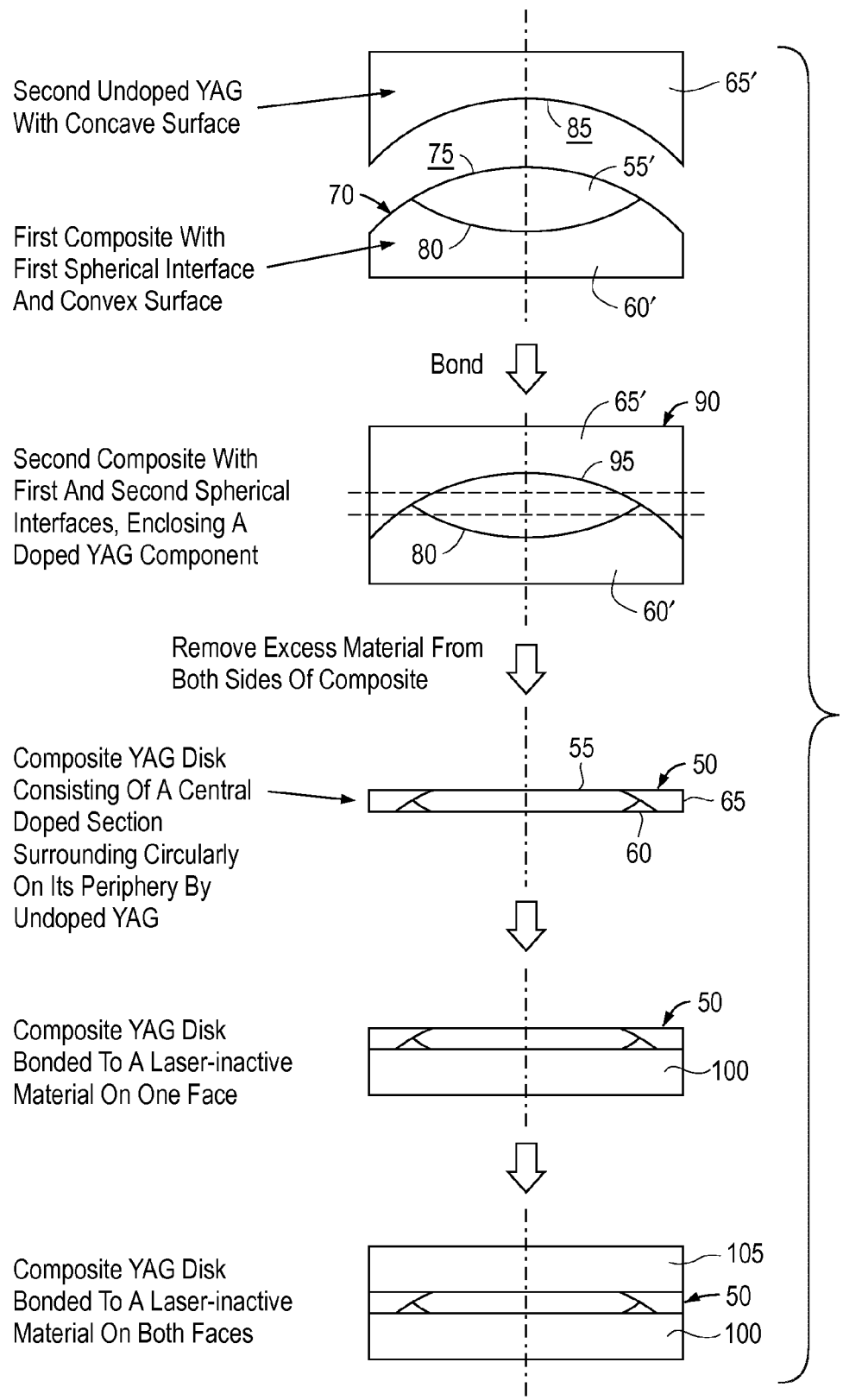

FIG. 2A and FIG. 2B show the range of possibilities that have become accessible when composites with one or two spherical surfaces are produced. FIG. 2A shows a process flow for forming a composite disk 20 having a central section 25 of a laser active material, such as doped YAG or GGG, that is surrounded by an outer section 30 of a laser inactive material such as undoped YAG (e.g., mono-crystalline or transparent polycrystalline species), sapphire, or spinel (magnesium aluminate, $MgAl_2O_4$). The two sections are bonded along a single curved surface. The process entails providing a doped component 25' having a convex (e.g., spherical) surface 32 and an undoped component 30' having a complementary concave surface 35. The upper part of the figure shows the two components spaced apart before being bonded. The lower part of the figure shows the components having been brought into optical contact and bonded according to one of the methods to be described in more detail below.

After the two components are bonded, they define a composite assembly 40 with a single bonded interface 45 (e.g., spherical), as defined by the complementary surfaces 25' and 30' of the respective bodies. Excess material is then removed from composite assembly 40 to provide the desired composite disk 20, with a radially central remaining portion of component 25' defining central section 25 and a remaining peripheral portion of component 30' defining outer section 30. A portion of interface 45 defines the single curved surface along which sections 25 and 30 are bonded. Although not shown in this figure, the resultant clad composite disk 20 could be bonded to one or two layers of laser inactive material on its disk faces, such as YAG, sapphire, or diamond, with or without optical coatings or roughened surfaces at the interfaces.

The excess material can be removed by any appropriate standard finishing operation that may include one or more of sawing, milling, fine grinding, and polishing. It may be desirable to salvage other portions of the composites to make disks with smaller and larger central sections if it is practical, and if there is a demand for them. In general, the bonding technique allows for the simultaneous fabrication of a number of disks of different central sections. In addition to spherical interfaces, conical or cylindrical interfaces are operable as long as an intimate contact between core and cladding is established.

FIG. 2B shows a process flow for forming a composite disk 50 having a central section 55 of a laser active material that is surrounded by two outer sections 60 and 65 of a laser inactive material. Suitable materials could include those described above in connection with composite disk 20. The process ultimately provides a three-component composite, and is shown with an undoped plano-concave component 65' and a component 70 to which it will ultimately be bonded. Component 70 is a two-component composite that includes a biconvex doped component 55' bonded to a component 60'. Component 55' has a first convex surface 75 and a curved second convex surface, which when bonded to component 60', defines a bonded interface 80. In this example, component 60' has a larger diameter than component 55' so that it has a concave surface over a central portion and a convex surface over a peripheral portion. Typically, such a composite component would be made by bonding a plano-convex component (precursor of component 55') to a plano-concave component (precursor of component 60'), and then grinding and polishing the precursor of component 55' to a degree that exposes the precursor of component 60'.

Component 65' has a concave surface 85, which is then bonded to convex surface 75 to form a three-component composite assembly 90 with an additional bonded interface 95. Excess material is then removed from composite assembly 90 to provide the desired composite disk 50, with a radially central portion of component 55' defining central section 55, and peripheral portions of components 60' and 65' defining outer sections 60 and 65. As shown in this figure, the resultant clad composite disk 50 is bonded to layers 100 and 105 of laser inactive material on its disk faces, such as YAG, sapphire, or diamond, with or without optical coatings or roughened surfaces at the interfaces.

The second aspect is based on the fact that a combination of a lasing medium of higher index of refraction with laser-inactive cladding layers of lower index results in wave-guided slab architectures. An example here would be a core layer of e.g., doped YAG with cladding layers of sapphire or spinel.

The third aspect is that removing heat from the lasing medium is one of the most important aspects for an efficient diode pumped solid state laser. While composites of doped with undoped GGG or doped and undoped YAG (without any dopant ions in the crystal structure) are a significant improvement over conventional doped solid state laser components such as rods or slabs, undoped GGG shares with doped GGG a similar thermal conductivity and closely similar refractive index. It is highly desirable to be able to combine the laser host medium with a laser-inactive material of higher thermal conductivity instead of its undoped counterpart and often also of different refractive index. By way of example, such a material would be single crystal sapphire, or diamond usually for the case of smaller size components although chemically vapor deposited polycrystalline diamond films are available in diameters up to about 4", but could be selected for different applications from a whole range of optical and electro-optic materials such as glass, silicon, silicon carbide, gallium arsenide, gallium phosphide or lithium niobate.

The goal of bonding is to achieve the highest possible bond strength between components consistent with their compatibility. When dissimilar materials are arbitrarily heated to high temperatures, they usually result in de-bonding or fracture. If they are not fractured, then their built-up stress is so high that the stress is spontaneously released during further processing so that they cannot subsequently be finished without fracture. Even lower heat treatment temperatures would already cause stresses that negate any usefulness of the composite with dissimilar materials when they have to be processed after bonding by conventional sawing, grinding and polishing processes.

The general question of which crystals are compatible with each other on bonding together presently lacks the scientific background for a priori selection. It appears that the tendency to undergo bonding that does not allow stress relief may be related to the intrinsic electronic structure of a crystal or glass surface. Qualitatively, the more inert the surface, the more compatible the component will be in dissimilar composites. Diamond is a crystalline material that possesses many extreme properties that are all very useful for engineering applications. It has the highest hardness of any known material, the highest thermal conductivity, extremely wide range of transparency between the ultraviolet and the far-infrared and is an electrical insulator. Diamond is a material that consists only of covalent bonds between carbon atoms in a close-packed tetragonal cubic structure and is, except when exposed to oxygen-containing atmosphere at elevated temperature, non-reactive with all materials of interest for solid state lasers. Therefore, diamond provides an extreme example of compatibility as one component of dissimilar composites. Its CTE is close to zero at room temperature, and since YAG, sapphire and other laser materials have higher CTEs, of the order of $7\text{-}8\times10^{-6}/^\circ$ C., there exists no close match in expansion with any of them.

Surprisingly, but probably explainable by its chemical inertness, diamond composites with sapphire or YAG have been stable after heat treatment. The surface roughness of most commercially available polycrystalline CVD diamond is quite high, of the order of 10-15 nm rms because its hardness and polycrystallinity renders it very resistant to conventional polishing and smoothing techniques. One factor which hinders the relative motion between diamond and the second component of a composite is believed to be just this roughness. When interferometrically observing in situ during heating and cooling in an evacuated chamber a composite component with an optical observation window, the surface figure changes of an external component surface, one can at least qualitatively deduce the level of stress that is generated during thermal treatment. The surface figure may start out perfectly flat but becomes convex or concave as the temperature changes, responding to developing stress. The process of stress relief is thus observed as proceeding discontinuously with periods of sliding, followed by periods of sticking, until the stress reaches a value that again causes further sliding. In extreme cases of diamond roughness, the sliding action is sufficiently hindered such that failure of the second component has been observed. Lowering the surface roughness on diamond facilitates the reduction of stress by relative sliding. The interferometric in situ observation of surface figures during heat treatment has enabled reaching stress-free or sufficiently stress-free conditions even when the relative motion consists of the stick-and-slide process.

An important finding is that to reduce stress or eliminate stress at room temperature, cooling to temperatures below ambient in a controlled environment as monitored by the surface figure changes allows the attainment of low stress by further sliding. The uniqueness of diamond as a component for composites of dissimilar materials is based on its chemical inertness, and may be utilized as intermediate layer to provide compatibility to any dissimilar materials that without diamond would form bonds that are too strong to be stress-free or low-stress. Diamond may be in form of free-standing sheet of thicknesses down to 20 micron or deposited as optical films of diamond-like carbon. Application examples of this finding are composites between laser crystals and nonlinear crystals for frequency conversion or combining $Nd:YVO_4$ with $Cr^{4+}$: YAG for passive q-switching. Depending on the specific applications, the two laser-active components that are separated by diamond may need to contain dielectric optical coatings at their interface.

Materials of different refractive index and different mechanical properties usually have CTEs that over the temperature range of heat treatment for bonding would not be identically the same. By way of example, a difference in CTE of only $0.1\times10^{-6}/^\circ$ C. would result in an estimated stress of 30 Mpa after heating to a bonding temperature of $1000^\circ$ C. Therefore, dissimilar materials would include any optical materials that differ in CTEs over the heat treatment range by at least $0.03\times10^{-6}/^\circ$ C.

Components of different CTEs are usually expected to result in stress when bonded to each other at any temperature other than the operating temperature, that usually is room temperature. There is a large body of literature that analyzes the stress and deformation when two materials such as vitreous enamel and metal or two metals are bonded to each other. A general theory of bending bimetal strips that are subjected to uniform heating is given by S. Timoshenko, "Analysis of bi-metal thermostats", J. Opt. Soc. Amer. 11, 233-255 (1925). The theory applies equally to bi-crystal strips, predicting their deformation and generation of stress during temperature change.

One aspect of the present invention deals with the discovery of a major deviation from this predicted stress-strain behavior of bimetal strips. YAG and spinel and other component pairs or triplets may serve as example. When examining the CTEs of YAG and spinel ($5.9 \times 10^{-6}/°$ C.), they are sufficiently different to expect very high stress after heat treatment. In fact, there was only very low stress present in either of the individual YAG or spinel components making up the bonded YAG-spinel structure. It is highly unlikely that YAG and spinel conform in CTE at higher temperatures so closely that no significant stress is being generated. YAG-spinel composites form a particularly useful combination of constituents for high power solid state lasers such as waveguiding slab architectures where the doped YAG core of refractive index of about 1.82 may contain one or two undoped YAG ends, also of about 1.82, and is sandwiched between spinel face cladding layers of refractive index 1.70 and potentially also side cladding layers.

In further attempting to provide a potential explanation of the existence of a stress-free region of heat treatment between dissimilar materials, intermolecular forces between solids are invoked that are, unlike short-range chemical bonds, of purely physical origin. The force between them is attractive and grows stronger with decreasing distance. A potential explanation for the attractive force is that it is due to the electrodynamic dipole-dipole interaction of waves of fluctuating charge along the surface of the solids, where fluctuations are quantum mechanical in origin. If the phasing is such that a positive charge fluctuation on the surface is located opposite a negative charge fluctuation on the other surface, there will be a net attraction of the two surfaces toward each other. The case of attractive dipole-dipole interactions is collectively known as van der Waals attraction. A special case exists for induced dipole-induced dipole interactions as a result of interactions between dipoles that are the result of the electric field produced by one dipole acting on a second dipole.

These attractive London or dispersion forces are present between molecules of all substances since all are polarizable and that is the only requirement for London forces (Paul C. Hiemenz, Principles of Colloid and Surface Chemistry, Chapter 10, Marcel Dekker, Inc. 1977). Not only is the dispersion component of the attractions the most ubiquitous but it also is the most important. Only in the case of highly polar molecules such as water is the dipole-dipole interaction greater than the dispersion component. Extending the molecular interactions to macroscopic bodies, one finds that they scale precisely. For instance, two molecules of e.g., 3 Å in diameter and 10 Å apart interact with exactly the same energy as two spheres of the same material which are 300 Å in diameter and 1000 Å apart. Considering macroscopic interactions at small separations, one can show that about 80% of the total potential energy of attraction arises from the interaction between the first blurred surface layer of molecules of each macroscopic block.

Up to now, it has been extremely difficult to measure intermolecular attractive forces directly between macroscopic bodies as function of their separation. The force previously has been measured from the displacement of a sensitive spring. The two principal sources of difficulty in this method are external vibrations and surface roughness. Therefore, the determination of attractive forces for a number of electrooptical and optical materials has been impossible or associated with prohibitive costs and great experimental skill and unsatisfactory reproducibility.

To produce components between larger crystals it is important to be able to determine the surface figure that is necessary and sufficient to obtain an intermolecular bond between components. For that purpose, we are employing a novel technique of measuring intermolecular forces between any materials—optical and non-optical—that have well-polished optical surfaces opposite the bonding surfaces. It consists of performing an optical contact between adjacent surfaces that are polished to an accurately measured, definable and describable surface figure, such as e.g., one or two convex surfaces. From the deviation of the outside surface figure and the extent of bonding between the two components, standard theory of bending of plates (ref Stephen P. Timoshenko and S. Woinowsky-Krieger, Theory of Plates and Shells, McGraw-Hill, 1983,) is employed to determine the force that has been in effect to bend the outside surfaces of the two components. The outside surface figure is measured interferometrically. This force per unit area is then equivalent to the intermolecular potential that exerts the attractive force. The possible deformation depends on the aspect ratio of the two components. This appears to be the first simple and reliable macroscopic demonstration of intermolecular forces that until now have been considered mostly weak and requiring perfectly flat surfaces for bonding. The methodology for extracting the bonding force is described in Lee, H-C, Meissner, H. E., and Meissner, O. R., "Thermally induced stress and strain in YAG/sapphire single crystal composites", Proc. SPIE Int. Soc. Opt. Eng., 5707 21 (2005). Using a cylindrical disk geometry allows to deduce quantitative data using well known analytical models.

This technique of determining the bonding force may be employed to evaluate the required surface figure for large surfaces to be bonded and for etched, roughened by other means, or patterned surfaces. Allowance has to be made for different aspect ratios of components when applying the data to disks and slabs of various designs.

The van der Waals interactive potential is dependent on the materials that oppose each other and on the surface area in contact. The surface roughness of the bonding surface may be modified according to the present invention by etching the polished surface using concentrated KOH by way of example. Thereby the variables of contact area and increased mean separation distance are introduced. The generated surface roughness in this case is not visually observable but is being measured using a commercial white light interferometer (Zygo NewView white light microscope interferometer). The rms surface finish of the etched surface has been determined to be of the order of ten times greater than that of the un-etched as-polished surface. The extent of roughness is dependent on conventional independent etching process variables such as etching time, temperature, stirring, concentration and type of etchant solution, type of crystal and crystallographic orientation of surface to be etched, roughness prior to etching and others.

A measuring technique such as a white light interferometer, atomic force or other sensitive stylus profile measurement should be available to determine at least on a relative scale the extent of roughness caused by etching and thereby monitor surface condition and contact area as bonding parameters. Although it is difficult to generalize the amount by which the surface finish should be increased to enable the practice of the present invention, it ranges between just 10-20% increase to 10-50 fold increase. The main considerations are the starting roughness of a precision polished surface, the compatibility between the surfaces to be bonded, the interface size and the minimum bond strength for an intended application. A very important limitation of the porous surface is the requirement that it is of continuous porosity to be applicable in the present invention.

A method of increasing the roughness of a surface to be bonded predictably and simultaneously deterministically correct surface irregularity and remove subsurface damage consists of employing magneto-rheological finishing (MRF). Commercial equipment is available from QED Technologies (Rochester, N.Y.). A specific example of machinery that enables processing flat surfaces that are rectangular or disk- or wafer-shaped as well as spherical and aspheric surfaces, is the Q22-Y model. Relevant information about deterministic magneto-rheological finishing is contained in U.S. Pat. Nos. 5,795,212 and 6,106,380. A wide range of MRF fluids is described in the patent literature besides commercially available polishing media. All have as goal to obtain as low a surface roughness as possible. Nanometer-sized diamond particles are frequently a component of MRF fluids to increase polishing removal rates while still obtaining surface roughnesses of the order of 0.3-0.5 nm rms. We have found that the addition of diamond powder in sizes of the order of up to microns allows to control the roughness of surfaces to be bonded, resulting in continuous porosity that accelerates the optical contacting step for bonding. The chosen particle size of diamond powder added to the MRF fluid depends on the hardness of the material to be made porous. Larger particle sizes are to be employed for hard materials.

When a composite is produced using pre-etched surfaces the interface loses its volatile film species in a time period that is of the order of 5-20% of what would be required without surface modification. Removal of volatile species of a pre-treated composite structure can be accelerated by use of a vacuum furnace since it does not exhibit clamping of the edges to seal in volatile components. On further heat treatment, the bonded interface visually appears to be defect-free.

The surface may be exposed to a number of alkaline or acidic etchant solutions or etchants in the gas phase, e.g., reactive ion etching, resulting in a patterned surface that may be regular or random in nature. Since intermolecular forces are related to actual close proximity between adjacent sets of atoms from opposing surfaces, close meaning below about 5 Å, then the intermolecular forces may be reduced by designing the pattern by exposure time and % contact at the interface. Especially for large surfaces, this is beneficial, or for materials where their intrinsic strength is reduced by cleavage planes. This allows the production of composites with materials of lower intrinsic strength. The pattern at the interface may be at the nanometer scale that does not influence the wavelengths used in the visible or near infra red, or the pattern may be in the micron range where it would have an effect on light transmission. An interface with an etched surface may have on average a lowered refractive index with even a gradient of average refractive indices, resulting in an effective antireflective coating at interfaces between the composite components. An example is a composite between $Nd:YVO_4$ and $Cr^{4+}:YAG$. While Nd-doped $YVO_4$, or in short $Nd:YVO_4$, has a cleavage plane parallel to the axc plane, and therefore becomes weaker than the intermolecular forces acting between YAG and $Nd:YVO_4$ crystal surfaces, a stable composite has been be produced according to this invention by pretreatment of the $Nd:YVO_4$ and of the $Cr^{4+}:YAG$ with concentrated KOH.

Another aspect of the present invention is to perform a modification of the interface that results in an extension of the temperature region in which intermolecular forces are active and chemical bonds are frustrated. This extension is achieved by deposition of a thin layer of carbon on at least one of the surfaces that will make contact when forming the composite. The layer is transparent to optical radiation and is too thin to form an optical barrier by itself. The reactivity of carbon with a variety of oxides or metals such as alumina, garnets or Si, SiC, diamond, and $LiNbO_3$ allows the extension of the range of heat treatment temperatures in which only or predominantly intermolecular forces are effective in holding bonded surfaces together, and therefore still allow sliding to balance strain due to thermal expansion differences.

A carbon coating may also be deposited onto surfaces that have been treated beforehand already by other means, such as deposition of optical coatings or of etched surfaces. By way of example, the carbon coating is deposited by heat treatment of the etched surface in an atmosphere containing a volatile hydrocarbon species such as methane or acetylene, and pyrolyzing at a substrate temperature range between 600-1200° C. for a time period between 30 minutes to 40 hours. Alternatively, the carbon may be deposited as chemically vapor deposited polycrystalline diamond. This transparent carbon film is assumed to be diamond-like but containing besides carbon also hydrogen. An actual analysis of the film has not been conducted but it results in an increase of at least 50-100° C. in the temperature to which the components may be heated without undergoing chemical bonding, and remaining stress-free.

An example is given in the following for determining the low stress region of a number of composites. It is assumed that intermolecular forces, against empirical expectation, do not resist movement as much as a chemical bond would, but allow relative movement between components parallel to their bond interfaces. Therefore, there appears to exist a region of heat treatment temperatures in which no stress birefringence is observed for any combination of two dissimilar materials. Above this critical temperature, bonds will be formed based on lattice rearrangements and chemical bonds that restrict the equilibration by relative movement of components. This appears to be a general principle that has been discovered and forms a basis for the present invention that is applicable to any combination of dissimilar composites of optical and electro-optic component materials.

This phenomenon is extremely useful as a tool to determine regions of compatibility between materials. It commonly would be expected that two materials of different CTEs would accumulate more stress as function of increasing heat treatment temperature. The range of applications of this invention extends from EO materials for use in solid state lasers to materials that are useful for integrated optical circuits and semiconductors. The invention is especially useful for producing composites with large interfaces.

Figure 3:
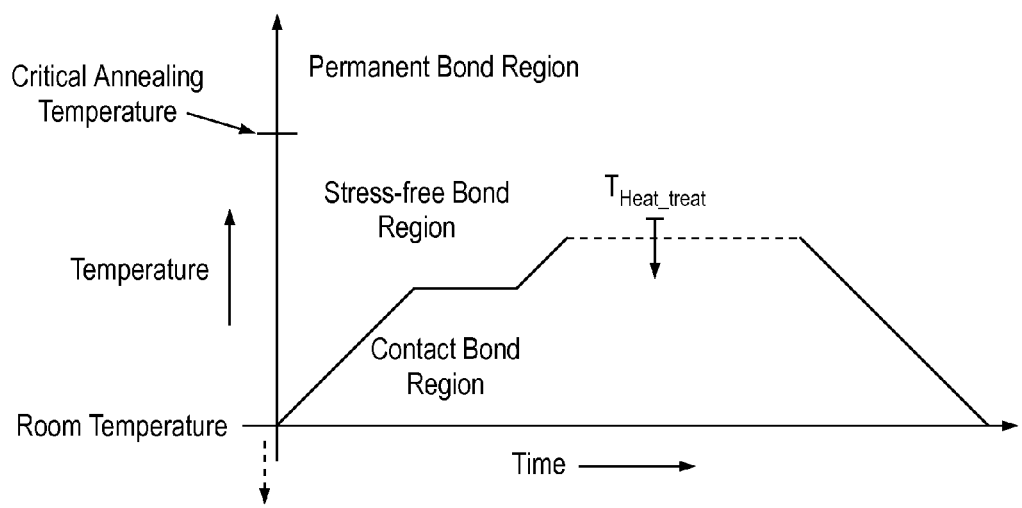
FIG. 3 is a schematic of temperature ranges for different bonding regimes.

FIG. 3 schematically depicts the stress-free region in which the preferred heat treatment will be performed. Composites in the lower temperature region are thought to be mainly held together by hydrogen bonds. Thereafter, the initial bonds are consolidated to stress-free bonds. A critical annealing temperature separates the stress-free region from where permanent chemical bonds are formed.

The technique of determining the region of compatibility as function of heat treatment can include one or more of the following:

1. Observation of onset of stress birefringence parallel to the interface in a composite structure
2. Observation of onset of bending of outside surfaces of a composite that was bonded with a surface figure of better than λ/10 surface at the interface.
3. Observation of movement between components, and measurement of the amount of movement.
4. Observation of de-bonding between the two components, or possibly breakage.
5. Observation of the deterioration of beam quality of a laser.

As an example of the present invention, the upper temperature limits for forming stress-free bonds between YAG and sapphire, YAG and GGG, YAG and spinel, spinel and sapphire, spinel and GGG, and sapphire and GGG composites have been determined. These stress-free composites are useful as examples for high power solid-state laser host components. Variables within each pair of bondable materials include dopant levels, dopant types, and crystallographic orientations of each of the bonding components. The outlined technique can be applied to finding the region of compatibility for bonding any two dissimilar single crystals to a stress-free composite.

Formation of stress-free adhesive-free dissimilar single crystal composites according to the present invention requires that the interface bonds are strong enough to withstand the downstream fabrication stress if further fabrication processing is required, and are sufficiently of a physical nature, as opposed to a chemical nature, to allow relative displacement upon shear in order to remain stress-free. The final requirement is that the bonds are strong enough to withstand the stress and environmental conditions during the intended use.

Candidate materials for composite formation have been selected for this example by their usefulness as solid state laser components. The materials include four single crystals, namely, YAG, sapphire, GGG, and spinel, respectively.

The bonding surfaces of YAG belong to one of the following three orthogonal surface planes, namely (111), (110), and (211), respectively. The bonding surfaces of sapphire belong to one of the following three orthogonal surface planes, namely, (0001), (10-10), (11-20), respectively. Actual GGG bonding planes are randomly oriented. The (100) plane of spinel is employed for bonding.

This example consists of six material combinations for doublets. Including crystallographic orientation as secondary variable, all subsets of YAG/sapphire composites are also shown in the following tables, designated Tables (a) and (b).

| (a) | | | |
|---|---|---|---|
| YAG | YnSn | | |
| GGG | GnSn | GnYn | |
| spinel | SLnSn | SLnYn | SLnGn |
|  | sapphire | YAG | GGG |

| (b) | | | | |
|---|---|---|---|---|
| YnSn | S1 | S2 | S3 | S4 |
| Y1 | Y1S1 | Y1S2 | Y1S3 | Y1S4 |
| Y2 | Y2S1 | Y2S2 | Y2S3 | Y2S4 |
| Y3 | Y3S1 | Y3S2 | Y3S3 | Y3S4 |
| Y4 | Y4S1 | Y4S2 | Y4S3 | Y4S4 |

Table (a) is a material matrix as the main set, and Table (b) is the crystallographic orientation matrix as the sub-set of the YAG/sapphire element in the material matrix.

Figure 4:
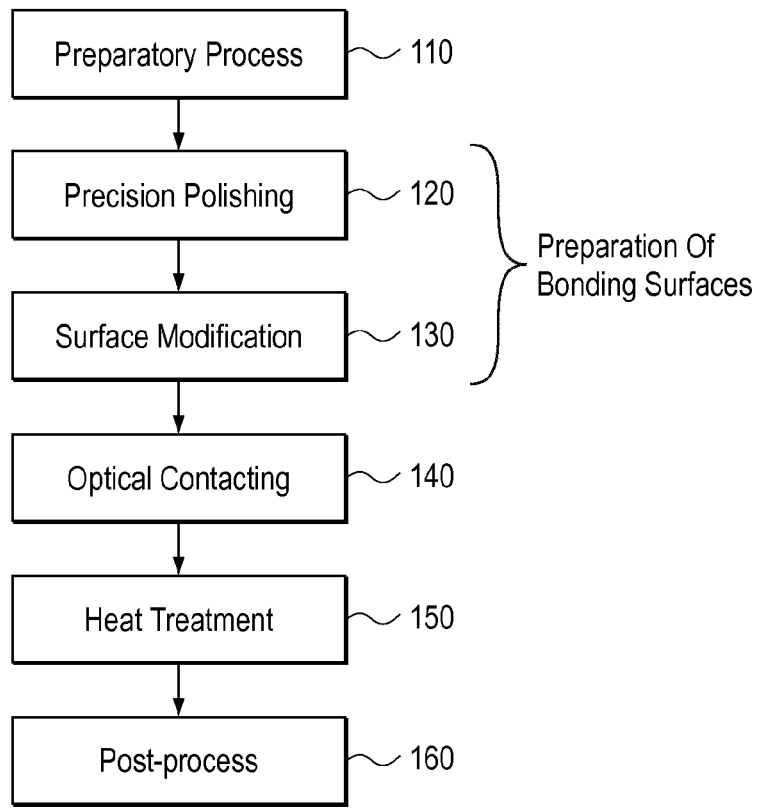
FIG. 4 is a schematic flow diagram of a process in accordance with embodiments of the invention.

FIG. 4 is a schematic flow diagram of a process in accordance with embodiments of the invention. In a step 110, preparatory processing of the components is performed. For example, blanks are cut to size and machined or otherwise formed to rough size. Other preparatory steps include fine grinding, computer numerical control (CNC) grinding, reducing the thickness to the desired thickness, pre-polishing with pads, and magnetorheological polishing. (Any of these processes would appear to be standard finishing operations). In a step 120, precision polishing of the components is performed to establish the desired surface figures for the components.

In a step 130, surface modification occurs in accordance with embodiments of the present invention. As discussed above, this surface modification can entail forming a sub-micron porous layer, or can entail chemically or mechanically pre-etching one or more of the surfaces to provide venting channels.

In a step 140, the components are caused to optically contact one another, and in a step 150, the contacting components are subjected to heat treatment to Ta (an annealing temperature that has been chosen to be below a critical annealing temperature). As mentioned above, the modification of at least one of the surfaces allows volatiles to escape, and/or may allow some relative motion that relieves stress. In a step 160, the bonded composite is subjected to post-processing. In this post-processing all outside surfaces are polished after heat treatment so that optical measurements may be performed. Post-processing could include polishing all surfaces, but not necessarily. For certain component designs, it is sufficient to polish two opposing parallel surfaces to measure the transmitted wavefront or to have optical coatings deposited. In some cases, it is desirable to prepare another surface for bonding after one or more bonds have been completed.

Figure 5:
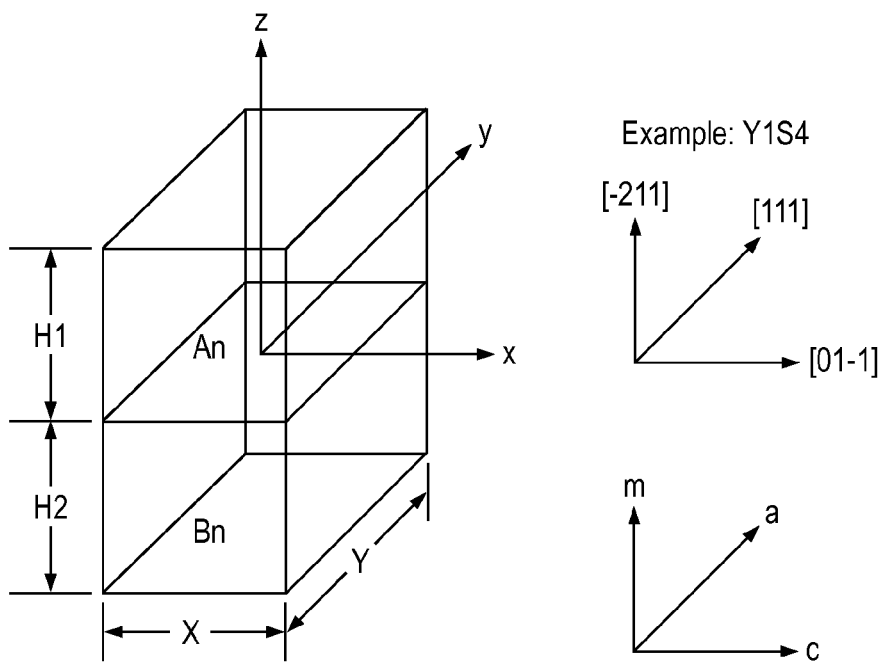
FIG. 5 shows an example of YAG/sapphire composite for heat treatment and optical measurements.

FIG. 5 shows representative shape and size of a binary dissimilar single crystal composite sample Y1S4. A typical binary single crystal composite as the following specifications: Geometry, coordinates, and dimensions: tetragonal with Y>X, Z=H1+H2. Material combinations: An≠Bn, where An∈{sapphire (Sn), YAG (Yn), GGG (Gn), spinel (SLn)}, Bn∈{sapphire (Sn), YAG (Yn), GGG (Gn), spinel (SLn)}, Sub-matrix: {sapphire (Sn): n=1, 2, to 4}. {YAG (Yn): n=1, 2, to 4}. {GGG (Gn): n=1}, and {Spinel (SLn): n=1}.

These dissimilar binary single crystal composites remain stress-free at room temperature and show no signs of relative displacement at the interface when the heat-treatment temperature is below a critical temperature $T_c$. They acquire internal stress and show relative displacement at the interface between two bonding crystals when the heat-treatment temperature is above $T_c$. The relative displacements between the 2 components have been measured using a white light microscope to nanometer accuracy, and the internal stress induced birefringence is measured using a polariscope. Both the onset of a displacement as well as the onset of internal stress are employed to monitor the transition temperature $T_c$ from a stress-free condition to stressed composites.

Figure 6A:
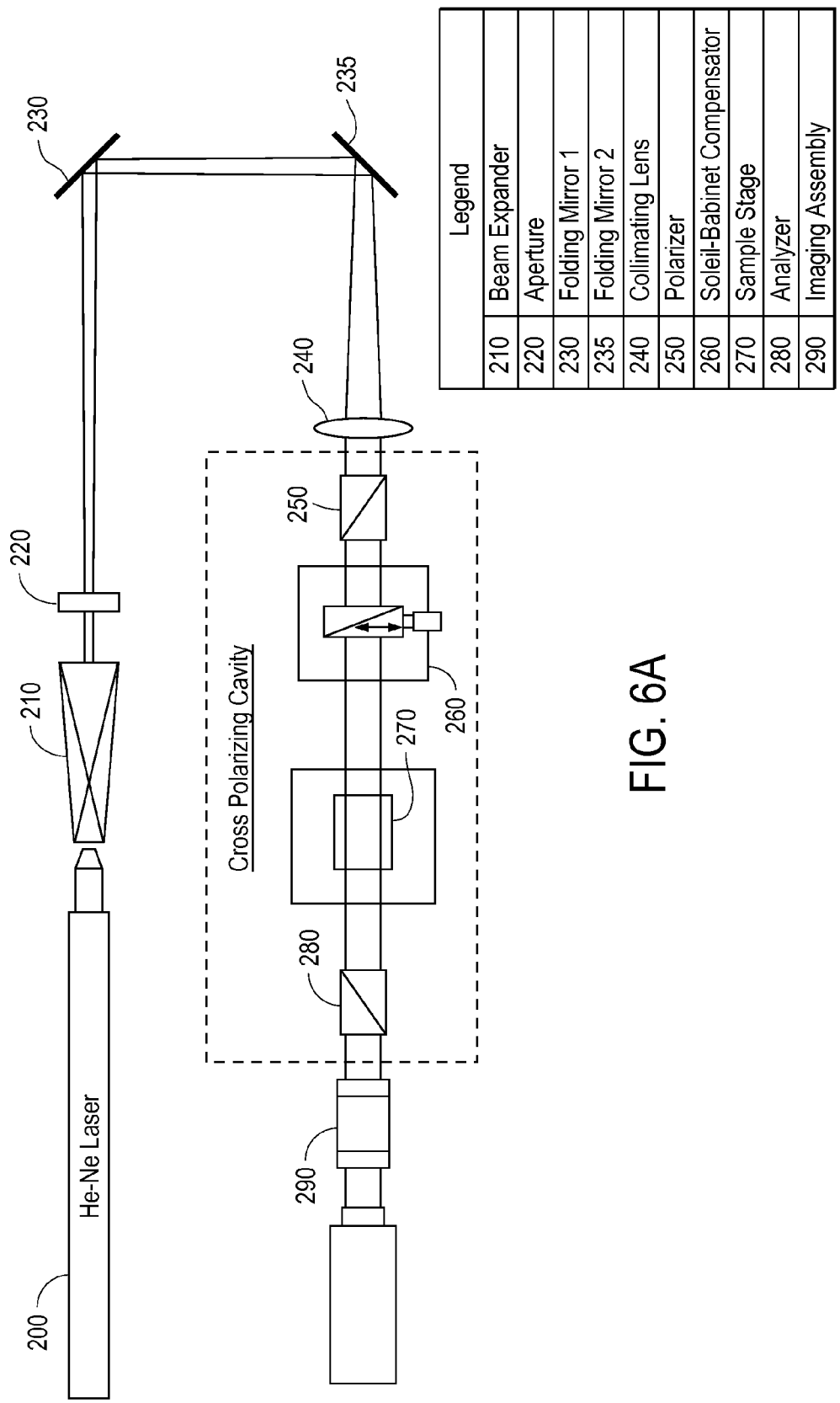
FIG. 6A shows a measuring setup for determining stress birefringence.

FIG. 6A shows a measuring set-up that has used been for determining stress birefringence and interferometry methods at 633 nm for strain measurements. The apparatus includes, in light path order, a laser 200 (He—Ne for the particular wavelength mentioned), a beam expander 210, an aperture 220, folding mirrors 230 and 235, a collimating lens 240, a polarizer 250, a Soleil-Babinet compensator 260 (basically a zero-order waveplate with variable retardation), a sample stage 270, an analyzer 280, and an imaging assembly 290. Aperture 220 rejects stray diffracted radiation and allows the beam diameter to be adjusted.

To find the upper limits for stress-free heat-treatment, one heat-treats the various combinations of binary single crystal composites to incrementally higher temperature. The residual stress after each heat-treatment process is determined by transmission through the samples placed between two linear cross polarizers. A stress-free condition is indicated by the complete extinction of transmitted light through the sample and conversely, residual stress is observed by the transmitted beam intensities and patterns due to stress-induced birefringence.

Figure 6B:
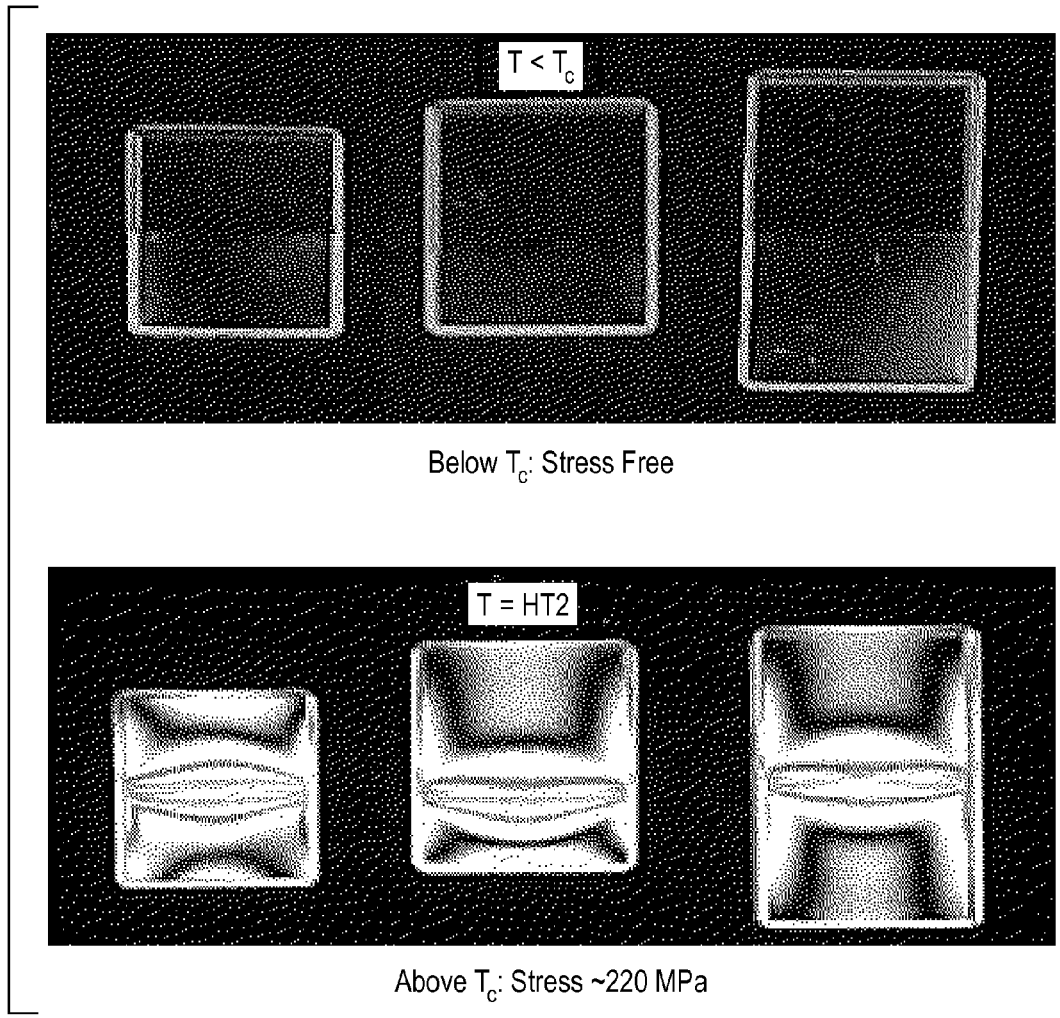
FIG. 6B shows some of the birefringence photos taken after the samples being heat-treated to below $T_c$ and to above $T_c$.

FIG. 6B shows some of the birefringence photos taken after the samples being heat-treated to below $T_c$ (left side of figure) and to above $T_c$ (right side of figure).

One finds the values of the critical temperature $T_c$ where the onset of stress observed mainly depends on the bonding materials and on their crystallographic configurations. They are arranged in the ascending order as follows;

$T_c$ (YAG/spinel)>$T_c$ (YAG/GGG)>$T_c$ (GGG/spinel)>$T_c$ (YAG/sapphire)>$T_c$ (GGG/sapphire)>$T_c$ (spinel/sapphire).

The residual stress above $T_c$ may be correlated to the residual strain by two parameters in this example. One parameter is the surface figure change on the outside surface parallel to the interface, and the other is the relative displacement of the edges of the bonded interfaces. The surface figure change is measured using a phase shift interferometer. The relative displacements of the edges of bonded interfaces are measured using a white light microscope interferometer. The extent of the outside surface figure change of the composite samples also is a quantitative indicator of the onset of the temperature region above $T_c$.

Figure 7A:
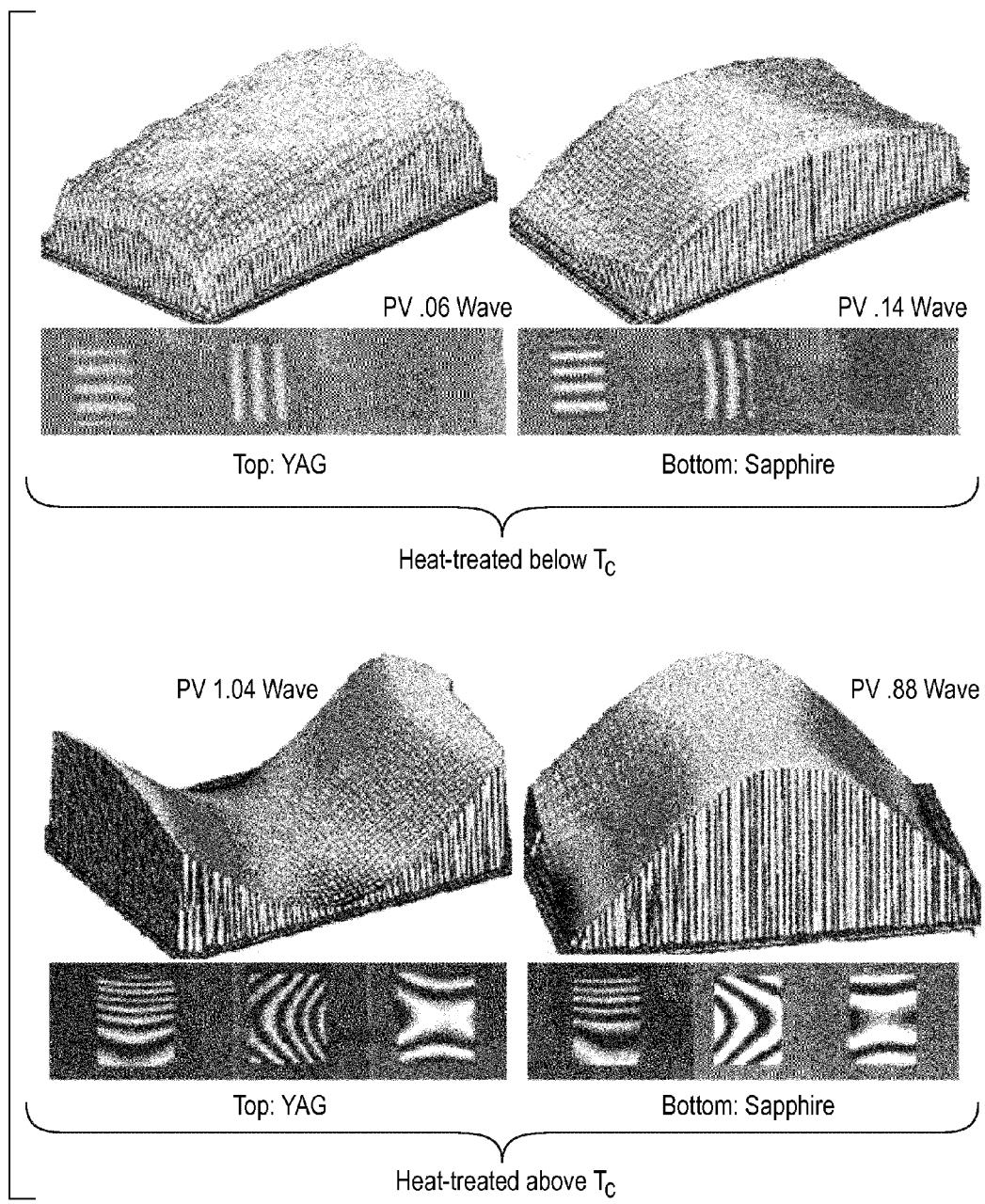
FIGS. 7A and 7B show measured surface figures of a YAG/sapphire and of a YAG/GGG composite, each below and above a critical temperature.
Figure 7B:
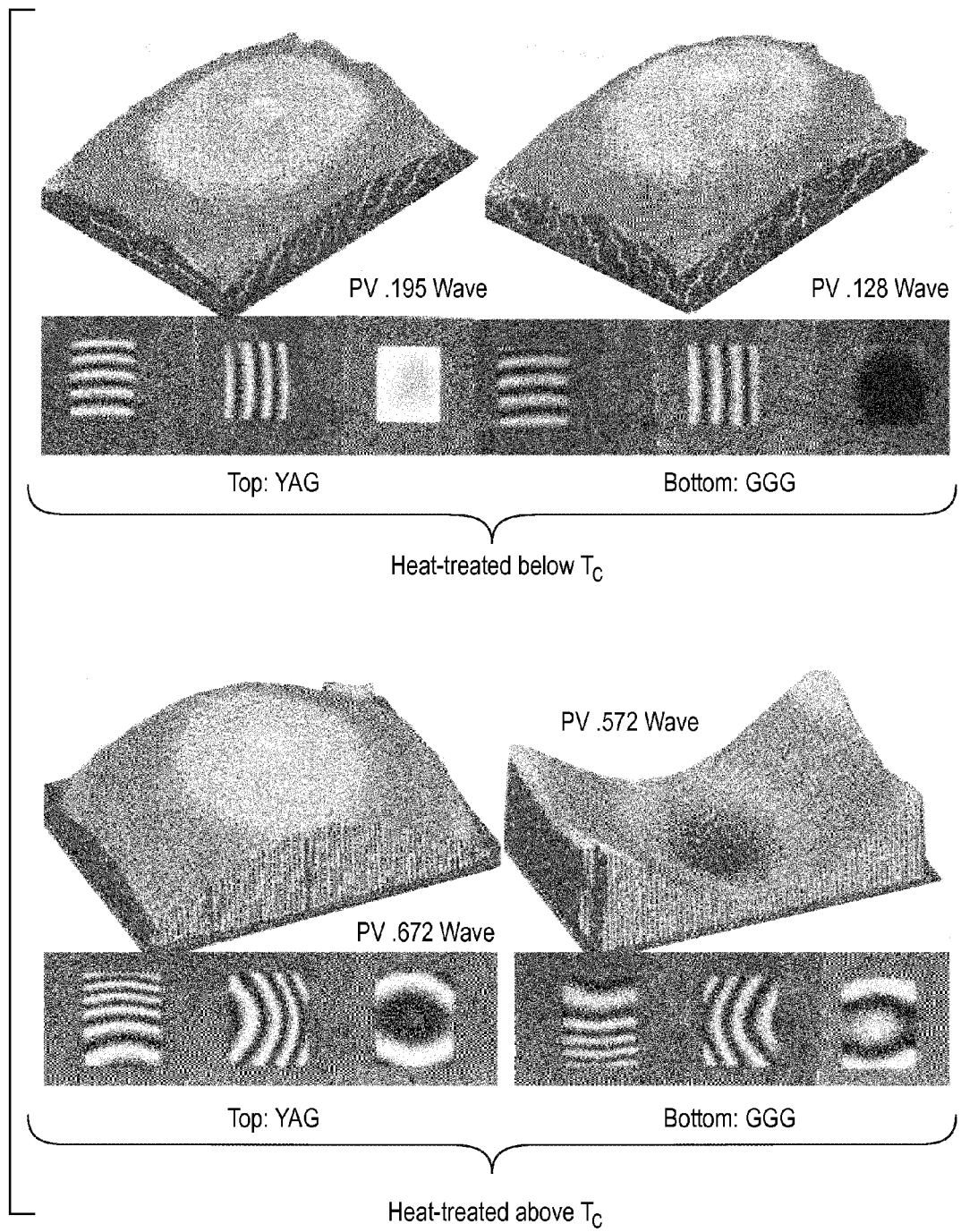

FIG. 7A and FIG. 7B show two sets of surface figures: one taken before the sample has been heat-treated above $T_c$ and the other taken afterwards. Within each set, the surface figures of the top surface and the bottom surface have been measured, respectively.

FIG. 7A shows the measured surface figures of a YAG/sapphire composite ($Y_1S_4$), while FIG. 7B shows the measured surface figures of a YAG/GGG composite ($Y_1G_1$) below and above $T_c$.

The surface figures of FIG. 7A and FIG. 7B are complementary pairs. The resultant surface figures are complex and can be characterized by two principal curvatures. One observes the anticlastic surfaces in the case of YAG/sapphire composites, the approximated cylindrical surfaces in the cases of GGG/sapphire composite surfaces due to the anisotropic crystal structure of sapphire, and spherical surfaces in the cases of YAG/GGG composites due to the isotropic cubic crystal structures of YAG and GGG.

While the availability of single crystals of laser-optical quality is higher than that of optical quality polycrystalline laser host and cladding media, the present invention applies equally to optical quality polycrystalline YAG, spinel and aluminum oxynitride, AlON. Conditions for etching and for bonding change due to the existence of grain boundaries and potentially due to different regions of stability for polycrystalline materials.

Conditions for heat treatment to an essentially stress-free condition change for different combination of dissimilar materials but are considered covered and to be accessible by this invention. Any modifications in experimental procedure that lead to attaining stress-free composite structures of dissimilar materials also appear within the scope of this invention when bonds are stable essentially due intermolecular attractive forces and not chemical bonds. Similarly, etching conditions and optical coatings at interfaces may require modifications, depending on materials properties, processing and performance specifications but are considered within the scope of the present invention.

As mentioned above, it has been determined that an optical coating on one of the surfaces to be bonded can be advantageous, even if the surface is not otherwise pre-treated by providing a porous interface layer or forming channels. We have performed measurements with the following three diamond/single-crystal composites:

CVD diamond and sapphire
CVD diamond and Yb:YAG; and
CVD diamond and coated Yb:YAG.

We performed experiments that demonstrate sliding in situ during heat treatment and cooling and have observed interference fringes change as function of temperature. We have quantitative data on the amount of stress before sliding and compare that with calculated stress if there was no sliding at all. We also have made calculations of Hamaker constants using equations in the literature on the theory of van der Waals bonding, and have confirmed them experimentally. Thus, van der Waals forces have been measured by a macroscopic and accurate technique, as opposed to experimentally difficult and ambiguous procedures.

The CVD diamond and single-crystal materials were in the form of disks having respective diameters of 12 mm. The diamond disks were 0.5 mm thick with roughness on the order of 1-2 nm rms. The single-crystal disks were 1.8 mm thick and the surface rms roughness of the polished, coated Yb:YAG, and sapphire surfaces are about the same, in the range of 2-4 Å. We optically contacted these at room temperature.

We then heat-treated the optically contacted composites to various temperatures to determine a heat-treatment process for each of the three sets of composites. The heat-treatment experiment provides valuable practical information for understanding the bonding mechanism as well as for developing an optimized bonding process. Since the thermal expansion coefficient of CVD diamond is much less than that of YAG or sapphire, we expect differential expansion to occur at the interface. Relative movement is necessary for the composite to remain stress free when the van der Waals forces are still strong enough to prevent de-lamination. The experimental data allow us to conclude that there is sufficient van der Waals attraction between CVD diamond and the other crystals to hold the composites together without de-lamination even though the separation distance can not be as small as in the cases of YAG/sapphire, YAG/YAG, and sapphire/sapphire composites.

To obtain insight into stress formation and release during heat treatment, we have observed surface distortion of one of the composite surfaces in situ during the heat-treatment cycle. The combination of the sensitive measuring capability of a phase shift interferometer capable of measuring <1 nm displacement and thermal control allows the measurement of surface distortion as a function temperature and time. We conducted in situ measurement of surface figure variation of CVD diamond/YAG, and the CVD diamond/coated Yb:YAG. Regions in temperature are observed where CVD diamond and the second bonded component slide, as well as other regions, where they stick and increase in stress.

We have found that the van der Waals forces between CVD diamond and single crystal YAG or sapphire are strong enough to form direct bonds. The larger separation distance caused by the rougher CVD diamond surfaces has been compensated by the greater Hamaker constant for CVD diamond/crystal composites. To find the Hamaker coefficients of the dissimilar composite systems we have used in this study, we need to know the Hamaker coefficients for sapphire/sapphire, Yb:YAG/Yb:YAG, and diamond/diamond, respectively. We have found the published data as follows: $A_{sapphire/vac/sapphire}$=168.7 zJ, and $A_{diamond/vac/diamond}$= 296 zJ.

We still need the value of $A_{Yb:YAG/vac/Yb:YAG}$. We have designed an experiment to extract the Hamaker coefficient of a Yb:YAG/Yb:YAG composite by comparing the surface deformation due to the attractive bonding force to that of the sapphire/air/sapphire system with a known $A_{sapphire/vac/sapphire}$ of 168.7 zJ assuming the separation distance of the two systems is identical. With the measured deformation of the Yb:YAG/Yb:YAG composite and the same separation distance calculated as 2.04 Å, we have found that the $A_{Yb:YAG/a/Yb:YAG}$ is about 227.5 zJ.

It is then possible to compute $A_{diamond/air/sapphire}$=223.5 zJ, and $A_{diamond/air/Yb:YAG}$=259.5 zJ, respectively. The difference between the two may explain that in the CVD diamond/air/sapphire system where the separation distance of 2 nm allows two bonding surfaces to slide without de-lamination, and in the CVD diamond/air/Yb:YAG system that with same separation distance, the attractive force is too strong to maintain a smooth interface zone for sliding. In the case of the CVD diamond/coated Yb:YAG system, the van der Waals attraction appears in between the former two systems. That may explain the stick and slide mechanism observed in situ. If we consider that the bonding surface of coated Yb:YAG is silica, we find that the Hamaker coefficient $A_{diamond/air/silica}$=139 zJ. Nevertheless, the thermal expansion coefficient between diamond and silica is much closer than diamond and YAG or sapphire. That may also explain why there is relaxation at the interface between coatings and CVD diamond.

While the above is a complete description of specific embodiments of the invention, the above description should not be taken as limiting the scope of the invention as defined by the claims.

What is claimed is:

1. An optical composite that comprises first and second components making optical contact across a porous interface layer derived from pretreatment of at least one of the two components forming the interface wherein the pretreatment provides a submicron-scale porosity with surface roughness greater than or equal to 50 Å rms.

2. The optical composite of claim 1 that contains a patterned structure at the interface between any two components.

3. The optical composite of claim 2 wherein the patterned structure depends on the crystallographic orientation of a single crystal.

4. The optical composite of claim 1 wherein the porous interface layer has antireflective properties.

5. The optical composite of claim 1 wherein the porous layer at the interface has an optical coating deposited.

6. The optical composite of claim 5 wherein the optical coating at the interface includes a transparent layer of carbon.

7. The optical composite of claim 5 wherein the optical coating at the interface includes one or more dielectric layers.

8. The optical composite of claim 1 with pre-etched channels in large-area interfaces to assist in venting trapped gas during optical contacting.

9. The optical composite of claim 1 wherein the bonding force of the composite has been reduced due to the reduced interfacial contact area.

10. An optical composite that comprises first and second components having complementary facing surfaces with an inert optical coating deposited on at least one of the facing surfaces prior to the first and second components being optically contacted, the optical coating impeding the formation of chemical bonds between the components, resulting in increasing the upper limit of heat treatment where the composite remains essentially stress-free.

11. The optical composite of claim 10 wherein the coating consists of transparent diamond-like carbon.

12. An optical composite comprising first and second components formed of dissimilar materials in optical contact at an interface wherein:
the first and second components were optically contacted using heat treatment over a temperature range;
an inert optical coating was applied to at least one of the first and second components prior to optical contacting; and
the temperature range of heat treatment is below the onset of chemical reactions at the interface; and
stresses developed between the dissimilar materials are relaxed by relative movement of the components parallel to the interface resulting in a stress-free or low-stress condition.

13. The optical composite of claim 12 wherein the inert optical coating comprises transparent carbon.

14. The optical composite of claim 12 wherein the optical composite consists of YAG and diamond.

15. An optical composite comprising:
a first component having a first surface; and
a second component having a second surface complementary to the first surface;
wherein,
the first and second components are in optical contact along an interface defined by the first and second surfaces; and
the first component has been pretreated to increase its porosity on the first surface wherein the pretreatment provides a submicron-scale porosity with surface roughness greater than or equal to 50 Å rms.

16. An optical composite comprising:
first and second components formed from dissimilar optical or electro-optical materials; and
a thin layer of diamond, selected from single crystal or polycrystalline diamond, applied to at least one of the first and second components prior to bonding the first and second components by optical contacting and heat treatment of the first and second components, wherein the inert property of the diamond provides improved bonding.

17. An optical composite consisting of a thin layer of initially free-standing diamond sheet sandwiched and bonded between two components formed from dissimilar and not directly compatible optical or electro-optical materials.

18. An optical composite consisting of at least two diamond components bonded to each other by optical contacting followed by heat treatment, selected from CVD polycrystalline, CVD single crystal, high-pressure grown single crystal and natural diamond.

19. The optical composite of claim 12 wherein the interface is a non-flat interface.

20. The optical composite of claim 19, where the bonded materials have an interface of a shape selected from spherical, cylindrical, and aspheric.

21. The optical composite of claim 20, where the bonded materials are processed into a disk consisting of a laser-active central section and a laser-inactive cladding section of circular cross section.

22. The optical composite of claim 1 wherein the pretreatment includes polishing to a surface roughness less than 50 Å rms followed by increasing the surface roughness to greater than or equal to 50 Å rms.

23. The optical composite of claim 15 wherein the pretreatment includes polishing to a surface roughness less than 50 Å rms followed by increasing the surface roughness to greater than or equal to 50 Å rms.

24. An optical composite comprising:

a first component having a first surface; and a second component having a second surface complementary to the first surface;

wherein, the first and second components are in optical contact along an interface defined by the first and second surfaces;

at least one component has been pretreated to form a pattern of channels on at least a portion of that component's respective surface to assist in venting trapped gas during a time when the first and second components are being brought into optical contact.

25. The optical composite of claim 24, and further comprising an optical coating on at least a portion of at least one component's respective surface.

26. The optical composite of claim 24 wherein at least a portion of at least one component's respective surface has been pretreated to increase its surface roughness to provide a porous interface.

27. The optical composite of claim 24 wherein the first and second components are similar materials.

28. The optical composite of claim 24 wherein the first and second components are dissimilar materials.

29. An optical composite comprising:

a first component having a first surface; and a second component having a second surface complementary to the first surface; and an inert optical coating deposited on at least a portion of at least one component's respective surface;

wherein, the optical coating becomes interposed between the first and second surfaces when the first and second components are brought into optical contact and subjected to heat treatment;

the optical coating impedes chemical reactions between the components during heat treatment so as to allow the relative movement of the components parallel to the interface during temperature changes and to increase the upper limit of heat treatment temperatures where the composite remains essentially stress-free.

30. The optical composite of claim 29 wherein the coating consists of transparent diamond-like carbon.

31. The optical composite of claim 12 wherein the optical composite consists of YAG and spinel.

32. The optical composite of claim 12 wherein the optical composite consists of YAG and silicon carbide.

* * * * *